United States Patent [19]

Schwenkler

[11] Patent Number: 5,752,532

[45] Date of Patent: May 19, 1998

[54] METHOD FOR THE PRECISION CLEANING AND DRYING SURFACES

[76] Inventor: Robert S. Schwenkler, 340 Old Saybrook Dr., Boise, Id. 83706

[21] Appl. No.: 721,363

[22] Filed: Sep. 26, 1996

Related U.S. Application Data

[63] Continuation-in-part of Ser. No. 516,235, Aug. 17, 1995, abandoned.

[51] Int. Cl.$^6$ .................................................. B08B 15/02
[52] U.S. Cl. ................. 134/102.3; 134/108; 134/95.2; 34/77; 34/470; 34/78
[58] Field of Search ................. 134/108, 102.3, 134/95.2; 34/77, 469, 470, 92, 78, 79, 76

[56] References Cited

U.S. PATENT DOCUMENTS

| | | | |
|---|---|---|---|
| 4,424,633 | 1/1984 | Bernhardt et al. | 34/77 |
| 4,777,970 | 10/1988 | Kushuhara | 134/66 |
| 4,778,532 | 10/1988 | McConnell et al. | 134/10 |
| 4,868,996 | 9/1989 | Ohmori et al. | 34/13 |
| 4,911,761 | 3/1990 | McConnell et al. | 134/11 |
| 4,917,123 | 4/1990 | McConnell et al. | 134/95 |
| 4,977,688 | 12/1990 | Roberson, Jr. et al. | 134/902 |
| 4,984,597 | 1/1991 | McConnell et al. | 134/95 |
| 5,052,126 | 10/1991 | Moe et al. | 34/78 |
| 5,054,210 | 10/1991 | Schumacher et al. | 34/74 |
| 5,055,138 | 10/1991 | Slinn | 134/11 |
| 5,069,235 | 12/1991 | Vetter et al. | 134/113 |
| 5,158,100 | 10/1992 | Tanaka et al. | 134/902 |
| 5,193,560 | 3/1993 | Tanaka et al. | 134/108 |
| 5,226,242 | 7/1993 | Schwenkler | 34/78 |
| 5,249,371 | 10/1993 | Saito et al. | 34/78 |
| 5,265,632 | 11/1993 | Nishi | 134/133 |
| 5,273,589 | 12/1993 | Griswold et al. | 134/95.2 |
| 5,288,333 | 2/1994 | Tanaka et al. | 134/31 |
| 5,304,253 | 4/1994 | Grant | 134/26 |
| 5,331,987 | 7/1994 | Hayashi et al. | 134/902 |
| 5,492,138 | 2/1996 | Taricco | 134/108 |
| 5,503,681 | 4/1996 | Inada et al. | 134/1 |
| 5,520,744 | 5/1996 | Fujikawa et al. | 134/102.3 |
| 5,539,995 | 7/1996 | Bran | 34/77 |

*Primary Examiner*—Frankie L. Stinson
*Attorney, Agent, or Firm*—Joseph W. Holland

[57] ABSTRACT

This invention pertains to a substrate cleaner and dryer or a dryer alone, and in particular, to an improved method of isopropyl alcohol (IPA) vapor drying having "closed loop" processing and capability to process extremely large substrates. The invention uses an inert gas, typically nitrogen ($N_2$) or argon (Ar), as a process gas for carrying the vapor of a drying fluid in a "closed loop" cycle through a process vessel. The carrier gas and is pumped through a vapor generator and the process vessel in a rapid "closed loop" manner with extremely pure IPA vapor. Various embodiments employ the invention including two different vapor drying methods, a water rinse and vapor dry method and a solvent clean and vapor dry method. In either the water rinse and vapor dry method and a solvent clean and vapor dry method rinse water or cleaning fluid is rapidly drained in an unimpeded manner from the vessel while the process vessel is vented.

6 Claims, 8 Drawing Sheets

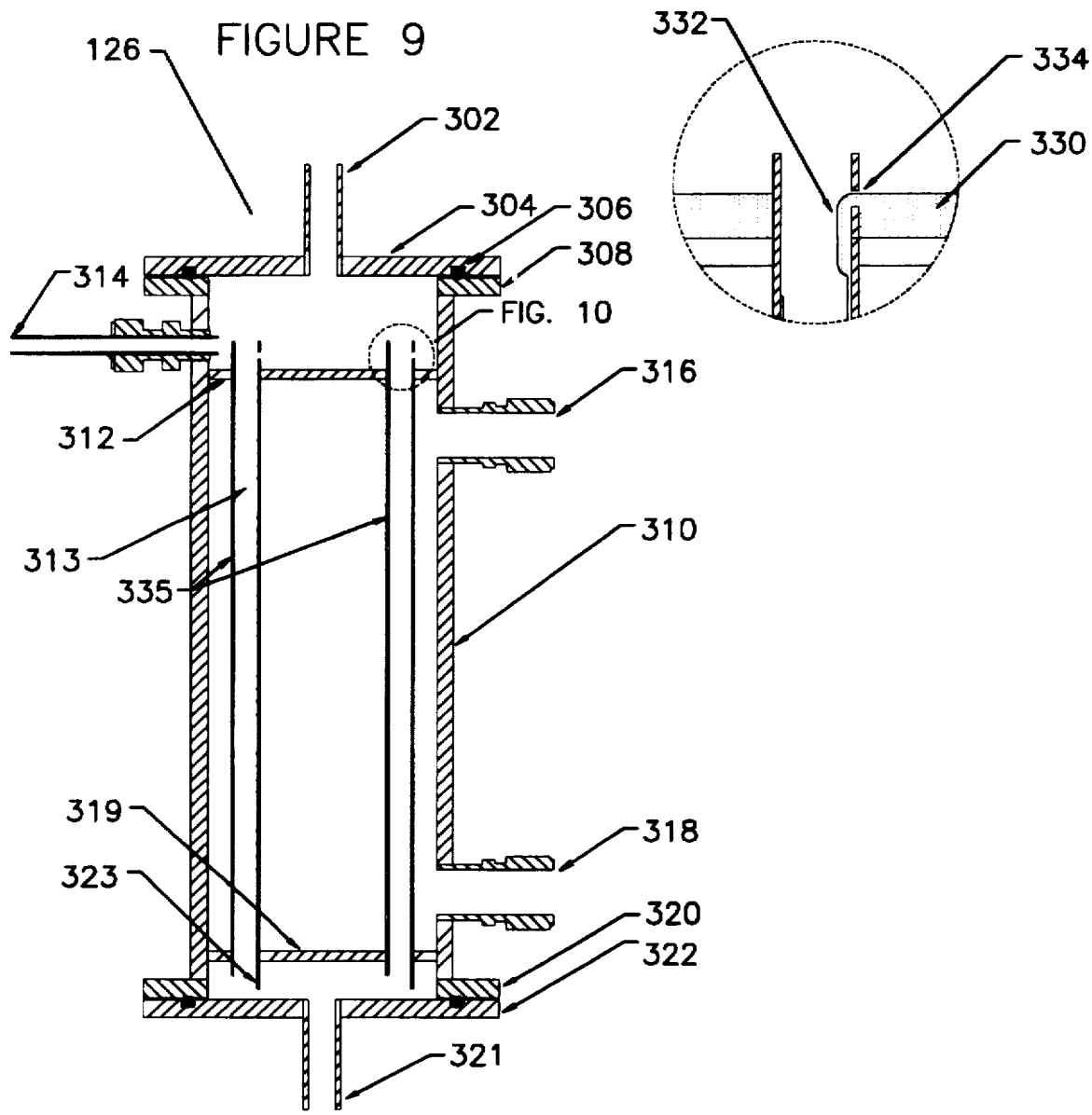

METHOD FOR THE PRECISION CLEANING AND DRYING SURFACES

RELATED APPLICATIONS

This application is a continuation-in-part application of application Ser. No. 08/516,235 filed Aug. 17, 1995, now abandoned.

DESCRIPTION

BACKGROUND OF THE INVENTION

1. Technical Field

The present invention pertains to a substrate cleaner and dryer or a dryer alone, and in particular, to an improved method of isopropyl alcohol (IPA) vapor drying with "closed loop" processing and capability to process extremely large substrates.

2. Background

Precision cleaning of critical parts uses various cleaning agents including acids, bases, aqueous based surfactants, solvents and other chemicals. After the cleaning process a final rinse with de-ionized water is typically required, to remove traces of the cleaning process. The final step is to remove, or dry, the rinse water from the part.

There are four commonly accepted methods of drying: 1) spin drying where centrifugal action throws water off the parts; 2) forced air drying where a huge volume of filtered air is moved past the parts; 3) vacuum drying; and 4) vapor drying.

Forced air and vacuum drying are prone to drying spots. Drying spots are unacceptable for critical parts such as semiconductor wafers and flat panel displays (FPD's). The drying spots result from evaporation of the rinse water from the surface of the parts. The drying spots are likely to be the accumulated dissolved elements which are present in even the highest quality de-ionized water. A combination of vacuum drying and vapor drying is taught in U.S. Pat. No. 4,977,688, but is limited in practicality due to drying spots.

Spin drying apparatus is subject to mechanical wear and failure, especially as parts increase in size, for example greater than 150 mm diameter semiconductor wafers and FPD's. The potential for mechanical damage and contamination to the substrates increases with larger size.

Vapor drying is a preferred method of drying critical parts. Vapor drying is a two step process. First, the parts to be dried are exposed to the vapor of a volatile substance which is miscible with water, preferably IPA. The vapor condenses onto the cooler surfaces of the substrates, effectively displacing and dissolving the rinse water. In the second part of the IPA drying process the IPA condensate is dried. If the IPA vapor is very pure, then the IPA condensate leaves no detectable residue after drying.

Common methods of vapor drying include: the boiling sump method; an inert gas laden with IPA vapor; and a process known as the Marangoni effect. The "boiling sump" method where a vapor zone is created by a boiling reservoir of IPA contained by walls on the sides and partially contained by cooling coils on the top. Product to be dried is passed in through openings in the cooling coils. Drying of the volatile condensate occurs when the substrates are slowly withdrawn into the low vapor zone area created by the cooling coils, as taught in U.S. Pat. Nos. 4,777,970, 4,868,996 and others. U.S. Pat. No. 5,249,371 to Saito et al teaches one such vapor dryer which includes an IPA liquid recirculation and reclaim loop. The contaminated IPA liquid is drained from the bottom of the dryer processing chamber, filtered and reintroduced into the processing chamber for later drying. No provisions are made for limiting IPA vapor emissions or recapturing IPA vapor which can escape through the cooling coils.

The second method uses a heated, inert gas laden with IPA vapor to introduce vapor to the substrates, followed by passing a dry, heated inert gas past the wafers to dry the IPA from the substrates, as taught in U.S. Pat. Nos. 4,911,761, 4,917,123, 4,984,597, 5,226,242 and others. The amount of heated nitrogen needed to dry the IPA is significant (25–100 cubic feet per dry cycle) resulting in increased cost of ownership which can equal the cost of the machine in one year. Both of these methods have major concerns for control of Volatile Organic Carbon (VOC) emissions. VOC's have been associated with increased ozone layer deterioration. Much work has been done to develop methods of post-process recovery or of vapor fumes from the machines. Present day methods of VOC recovery are: 1) charcoal filtration which can provide excellent emissions reduction, however frequent saturation of the charcoal occurs and the problem remains as to what to do with the saturated charcoal; 2) cryogenic chilling of gas effluent has limited performance due to the high volatility of the effluent and cost and complexity of the required apparatus; 3) methods of burning the effluent are available, but these have high cost and safety concerns associated with them; and 4) water based effluent scrubbers are available but then solvent contaminated water must be dealt with. All these efforts add to the cost and complexity of present day vapor dryers and are not energy efficient.

U.S. Pat. No. 4,984,597 McConnell et.al. discloses an apparatus for rinsing and drying surfaces. The described apparatus includes a vapor generator (vaporizer), a process vessel (vessel for holding wafers) and a boiler for concentrating used rinsing fluid and drying vapor for disposal or reuse. Essential to the method of drying described in McConnell is the backfilling of the process vessel with a drying vapor upon draining of water from the vessel and a relatively slow and controlled rate of draining or lowering of the gas-liquid-solid interface, in the range of one to four inches per minute. The mechanism for drying disclosed and claimed in McConnell et.al. relies upon supplying the drying vapor directly to the surface to be dried, upon draining the water, thereby replacing the water or rinsing fluid by directly displacing the rinsing fluid a such a rate that substantially no liquid droplets are left on the surfaces after replacement of the rinsing fluid with drying vapor.

Other drawbacks to the existing methods of vapor drying are safety related. There is concern due to the direct electrical heating of the vapor zone area and vapor generating area. The potential for explosion exists and special precautions are needed to minimize possibility of vapor or IPA ignition, such as nitrogen purged and sealed heater zones, vapor suppression means such as water mist, etc. Additionally, many existing methods are restricted in function since they cannot be used to combine the final water rinse and dry.

Another method of vapor drying similar to U.S. Pat. No. 4,984,597 is a process known as the Marangoni effect. In this method, the substrates are withdrawn from the rinse water in a slow, precise manner, one to five inches per minute, while a vapor stream is directed at the air-liquid interface. The intent is to have the liquid pull from the substrates as the water recedes, with the aid of the vapor and precise withdrawal of the substrates or water. Key to this method of drying is to leave no droplets behind. This method is prone to improper drying at crevices on the substrates or other such water entrapment points, such as notches in the substrate holder. This method is efficient in emissions reduction and IPA consumption, but due to the need for precise and slow substrate withdrawal, shapes and sizes of product to be dried are limited. Furthermore, this method is limited to rinsing and drying. A "dry only" process is not available using this method.

What is needed is an apparatus and process that:

Circumvents the added expense and increased complexity of post-process recovery by utilizing a "closed loop" system allowing for highly efficient vapor usage and precision drying of extremely large substrates such as FPD's;

May be configured as either a dryer or a combined rinse and dry machine and method;

Provides for a cleaning process and apparatus which does not use de-ionized rinse water;

Seals the process fluid from the environment, letting nothing into or out of the process vessel during the process cycle;

Utilizes a method of vapor recirculation having a means for replenishing the vapor with a vapor generator, external from and distinct to the process vessel;

Substantially removes all process vapors from the process vessel so that there is essentially zero emissions to the environment during loading and unloading of the process vessel;

Removes process vapors from the process vessel and directly stores the vapors for condensation of excess vapor;

Provides a cleaning process which uses solvent cleaning followed by IPA drying, with no need for rinse water;

Improves safety through the absence of electrical heaters in the vapor generation area;

Provides a cost efficient method of vapor drying capable of processing any type and size of substrate with minimal environmental and personal hazard; and Provides a cost efficient method of vapor drying capable of processing any type and size of substrate which is capable of either rinse and dry processing or a "dry only" processing.

SUMMARY OF THE INVENTION

These and other objects are achieved by the invention. The invention is capable of cleaning and/or drying substrates or parts of various shapes and sizes and is capable of cleaning and/or drying extremely large substrates such as FPDs. Additionally, the invention is capable of cleaning and/or drying other substrates such as silicon wafers used for manufacture of semiconductor devices, platens used for disk drives, optic lenses, specialty metal parts, etc.

The present invention uses an inert gas, typically nitrogen ($N_2$) or argon (Ar), as a carrier or process gas for the vapor. The process gas is pumped in a "closed loop" cycle through a process vessel with means to introduce extremely pure IPA vapor into the carrier gas. The vapor "rinses" water from the substrates by reduction of surface tension between the water and surface of the substrate, or other article being dried. Once removed from the substrate, the water is removed with the cycled carrier gas or may be drained as liquid. Several embodiments may employ the present invention including two different vapor drying methods, a water rinse and vapor dry method and a solvent clean and vapor dry method.

The first embodiment of the invention is a "dry only" process. Many workplaces have existing cleaning and rinsing equipment and desire only a high purity drying machine. In the "dry only" process, the process vessel is filled initially with an inert gas. Argon is the preferred gas, since it is heavier than air and will not easily escape the process vessel when the lid is opened to load wet product to be dried. In this embodiment, product is cleaned and rinsed in machines separate from the present invention. The wet product is loaded into the argon filled process chamber. A slow argon purge may be introduced during loading and unloading to prevent air entry into the chamber. Once loaded, the process vessel is sealed. Now the inert process gas acts as a carrier and is pumped through the process vessel and a vapor generator in a rapid "closed loop" manner with extremely pure IPA vapor. Following a predetermined period of vapor recirculation, the IPA vapor and the carrier gas and residue liquid are evacuated from the process vessel. The evacuated carrier gas and vapor are directed to a storage pressure vessel, for condensation of vapor, to be expelled and/or evacuated prior to the subsequent process cycle. The process vessel is now in a subatmospheric state. To prepare for unloading the dried product, an inert gas, once again, typically Ar, is introduced into the process vessel to return the process vessel to atmospheric pressure and prepare the process vessel for the next cycle.

An alternate embodiment of the "dry only" method employs the steps set forth above with the following exceptions: the process vessel is not pumped down to a subatmospheric level following the vapor recirculation portion of the cycle, and therefore there is no need to return the process vessel to atmospheric pressure using an inert gas following the vapor recirculation portion of the cycle. Rather, cleanroom air or an inert gas is simply allowed into the process vessel upon opening, allowing the parts to "air dry".

Another embodiment of the invention employs both rinse and dry processes. In this embodiment, the process vessel may be filled initially with water. Product to be dried is placed within the process vessel and the vessel is sealed. A final water rinse may be done at this time. In the rinse and dry process, following the rinse cycle, the water is rapidly drained in a substantially unimpeded manner from the process vessel, thereby allowing the subsequent phases of the process cycle to follow as quickly as possible behind the draining phase. The term "substantially unimpeded" as used herein means draining rates in the range of 5–60 seconds per 12 inches of water or other rinsing fluid drained from the process vessel. During evacuation of water from the process vessel, an inert gas fills the void created by the draining water.

Following evacuation of water from the process vessel, the inert carrier gas is cycled with extremely pure IPA vapor through the process vessel and the vapor generator by a gas pump in a rapid "closed loop" manner. It is important to the invention to allow this phase of the process cycle to initiate as soon after draining begins so that no drying of water is allowed to occur before initiation of the cycling of IPA laden carrier gas.

Following a predetermined period of vapor recirculation, the IPA vapor and the carrier gas are evacuated from the process vessel which is maintained at a subatmospheric level. The evacuated carrier gas and vapor are directed to the storage pressure vessel. To prepare for unloading the dried product, an inert gas is introduced into the process vessel to return the process vessel to atmospheric pressure and prepare the process vessel for the next cycle.

An alternate embodiment of this method uses both solvent cleaning and vapor drying processes. Additionally, it may be desirable to incorporate mega/ultrasonic scrubbing into the process vessel. A great advantage to the solvent rinse vapor dry method is that it allows for a full cleaning process that uses no water rinse. In the solvent rinse vapor dry method, the process vessel containing product to be processed, is completely filled, excluding any air, with a solvent or other cleaning fluid thereby eliminating the water rinse. The cleaning fluid is selected from the group of cleaning fluids including IPA, MEK or acetone. Typically IPA liquid is used although other agents may be utilized depending upon the desired result. The product is then processed, for example, with the ultrasonics. The solvent is then drained and the vessel is backfilled with an inert process gas. Alternatively, process gas may be drawn out of the process gas storage vessel and pumped into the top of the process vessel to fill the void created by the exiting solvent. The drying portion of the process is carried out in the same manner described immediately above.

In each of the above embodiments, an inert process gas acts as a carrier gas which is pumped and recirculated through the process vessel and a vapor generator in a rapid "closed loop" manner with extremely pure IPA vapor. Additionally, in each of the above described embodiments, at the end of the drying cycle, the process gas may be stored in a storage pressure vessel rather than being expelled. In this manner, the gas may be kept for use in subsequent process cycles.

Additional objects, advantages and novel features of the invention will be set forth in part in the description that follows, and in part will become apparent to those skilled in the art upon examination of the following or may be learned by practice of the invention.

BRIEF DESCRIPTION OF THE DRAWINGS

FIG. 9 is a cross section view of the vapor generator taken along section line 9—9 of FIG. 8; and FIG. 10 is a cross section view of a vapor generator tube showing a metering orifice.

DETAILED DESCRIPTION OF THE INVENTION

Figure 1:
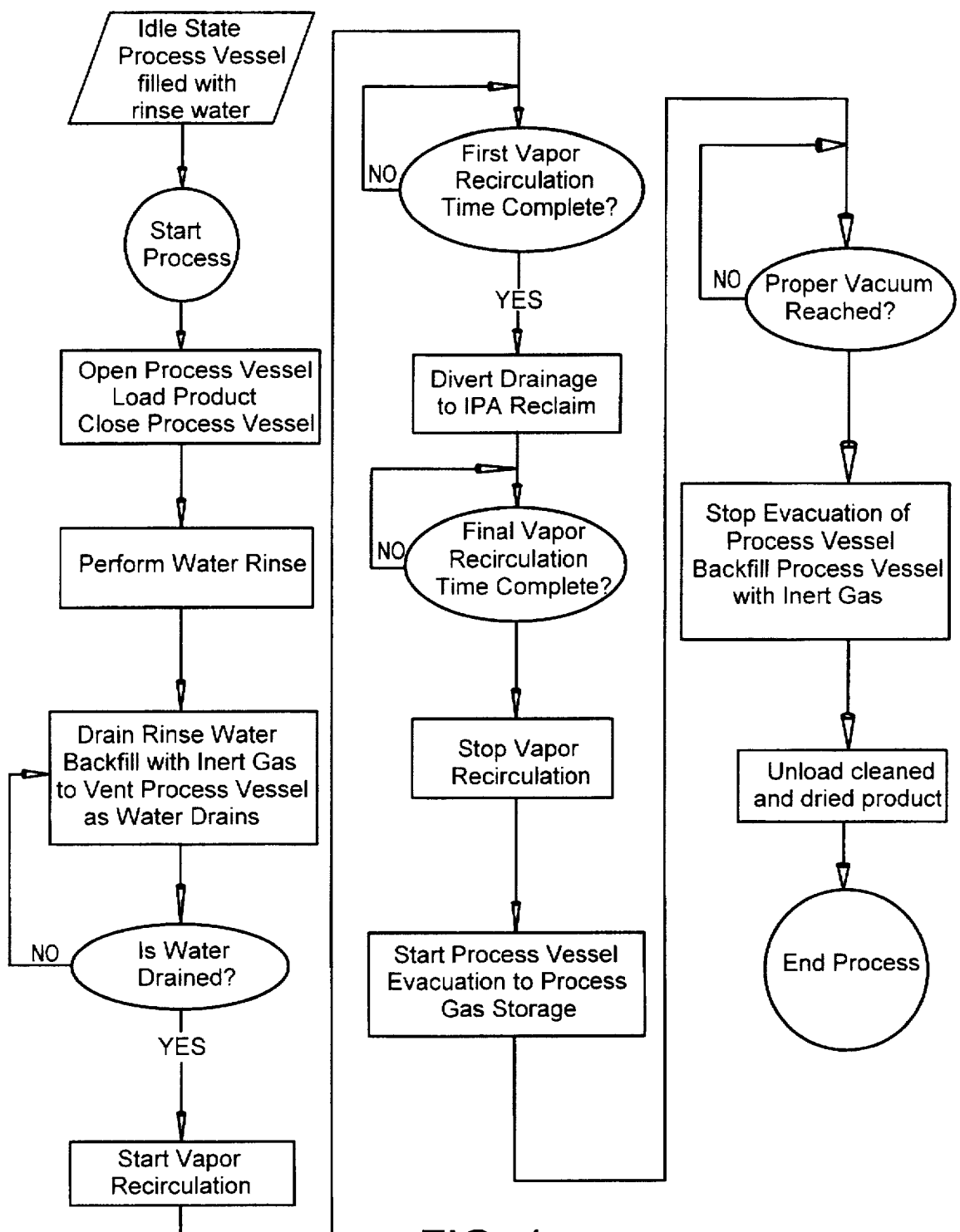
FIG. 1 is a schematic flow process diagram of a water rinse/vapor dry embodiment of the invention.
Figure 2:
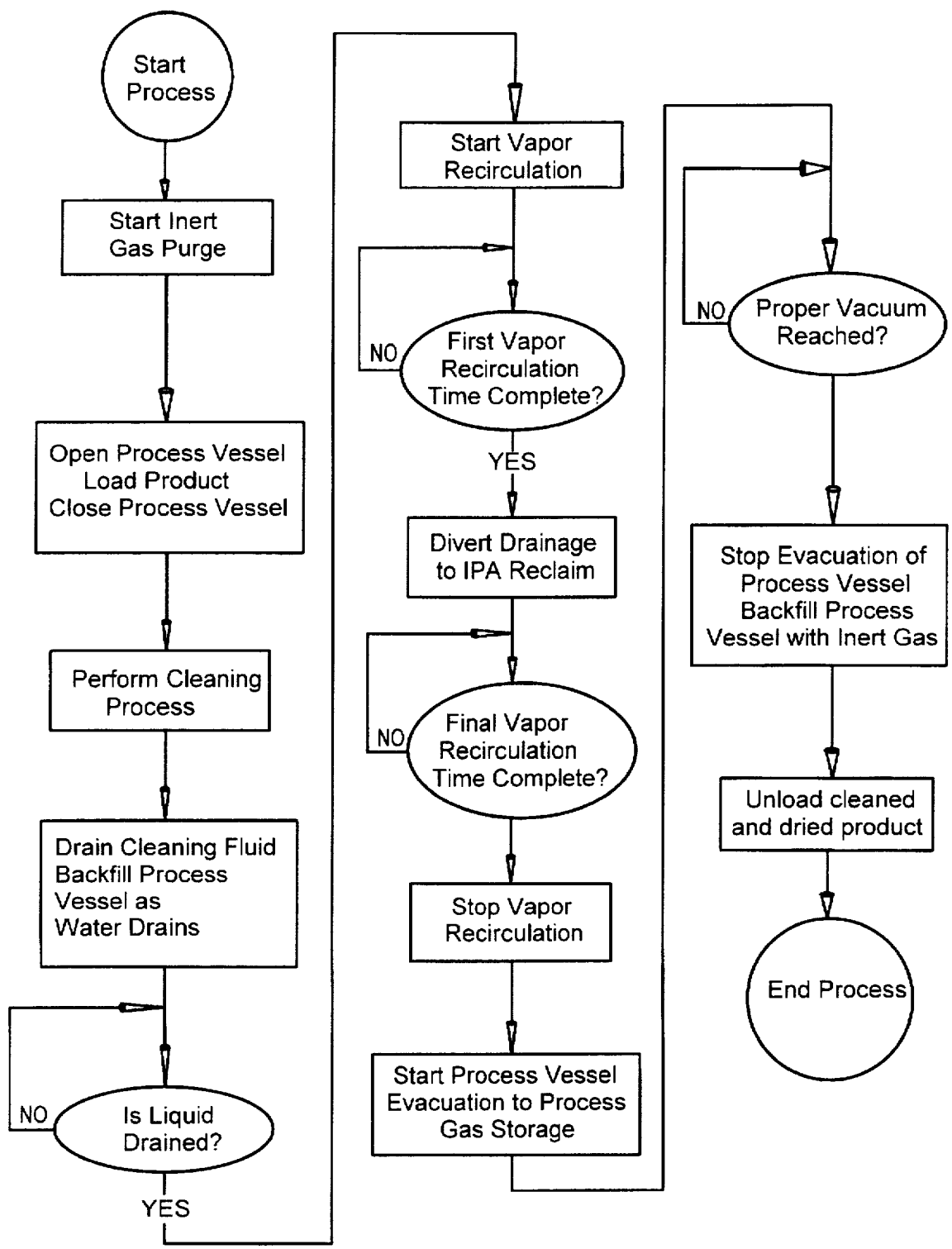
FIG. 2 is a schematic flow process diagram of a solvent clean/vapor dry embodiment of the invention.

FIGS. 1 through 4 are flow diagrams depicting several of the alternative embodiments of the present invention. FIG. 1 is a schematic flow process diagram of a first embodiment of the invention for a water rinse and dry method. FIG. 2 is a schematic flow process diagram of an alternate embodiment of the rinse and dry method of the invention which substitutes solvent cleaning for the water rinse.

Figure 3:
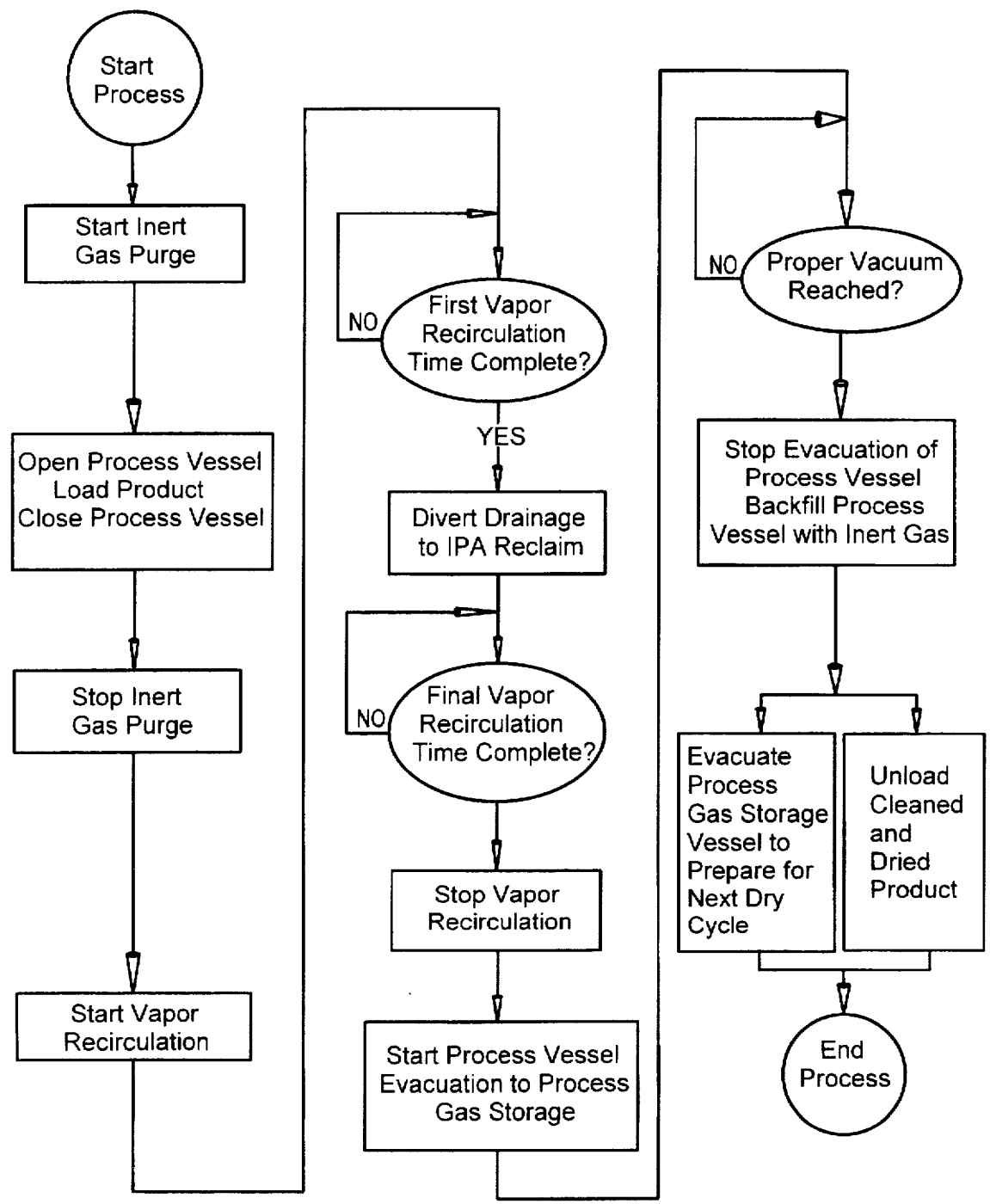
FIG. 3 is a schematic flow process diagram of a "dry only" embodiment of the invention.
Figure 4:
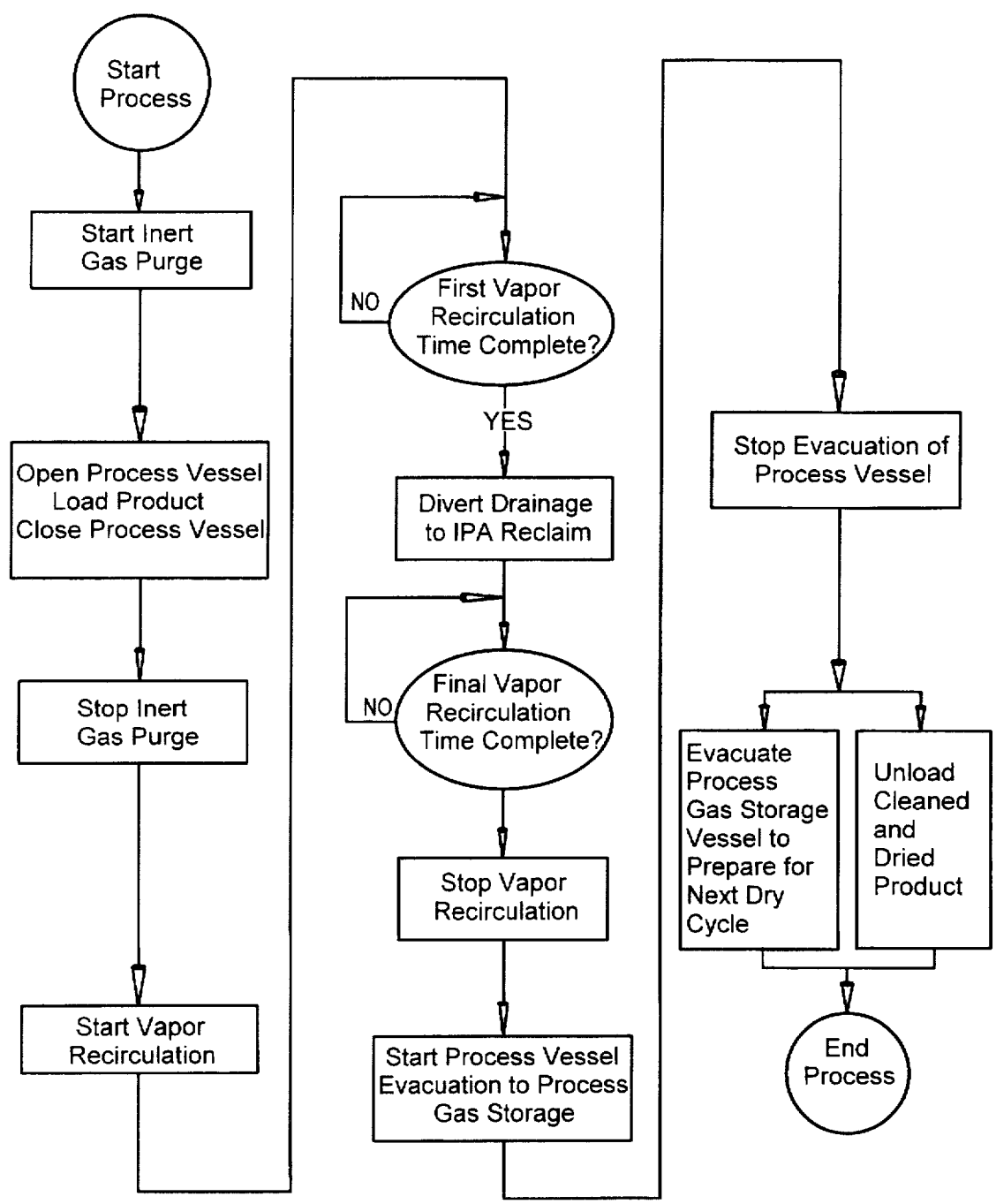
FIG. 4 is a schematic flow process diagram of an alternate of the "dry only" embodiment of the invention.

FIG. 3 is a schematic flow process diagram of an alternate embodiment of the invention for a "dry only" method including the steps of pumping the process vessel down to a subatmospheric level following the vapor recirculation portion of the cycle, and returning the process vessel to atmospheric pressure using an inert gas following evacuation of process gas and pumpdown. FIG. 4 is a schematic flow process diagram of an alternate embodiment of the "dry only" method of the invention which eliminates the steps of pumping the process vessel down to a subatmospheric level following the vapor recirculation portion of the cycle, and returning the process vessel to atmospheric pressure using an inert gas following evacuation of process gas and pumpdown. Rather, air is simply allowed into the process vessel upon opening to remove product allowing the parts to "air dry".

FIGS. 5 through 11 illustrate an apparatus which employs both rinse and dry processes. In reviewing the included FIGS. 5 through 11, the reader is reminded that while these Figures depict the embodiment of the present invention which employs both rinse and dry processes the Figures are not intended to limit the scope of the invention.

Referring to FIGS. 5 through 11, the embodiment of the present invention which employs both rinse and dry processes is comprised of three definable subassemblies; process vessel and drain piping subassembly 161, vapor generation subassembly 162 and vapor recirculation subassembly 163.

Process vessel and drain piping subassembly 161 comprises process vessel 100 which may function both as a rinsing vessel, a cleaning vessel and/or a drying vessel. Process vessel 100 may change in basic shape and structure to accommodate different substrate shapes and sizes. The preferred embodiment described here is designed to process twenty 15 inch×20 inch FPD's.

Figure 6:
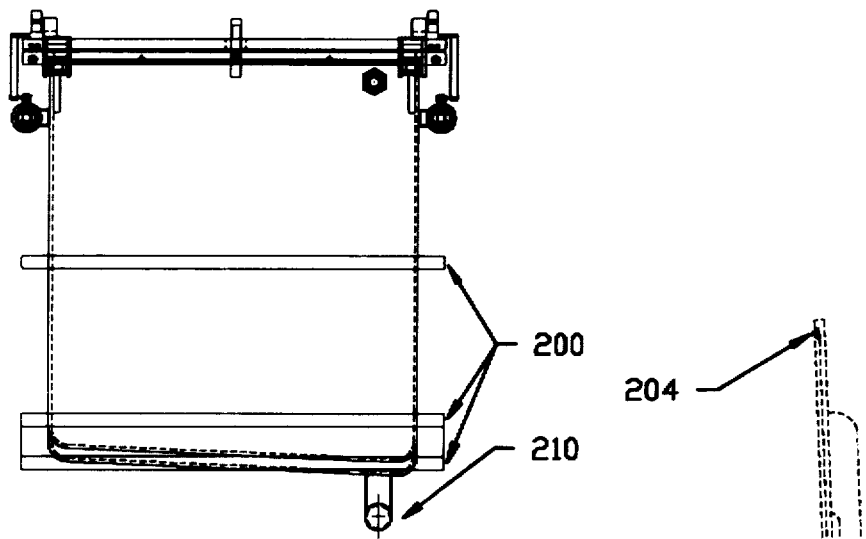
FIG. 6 is an end view of a process vessel.
Figure 7:
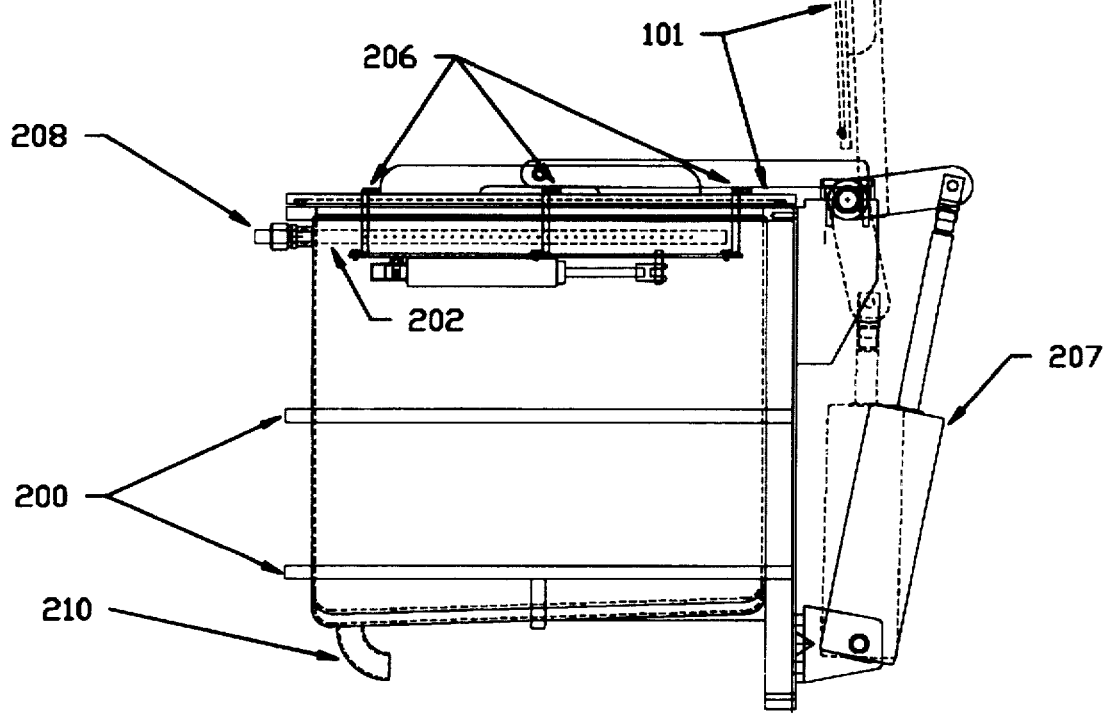
FIG. 7 is a side view of the process vessel of FIG. 6.
Figure 8:
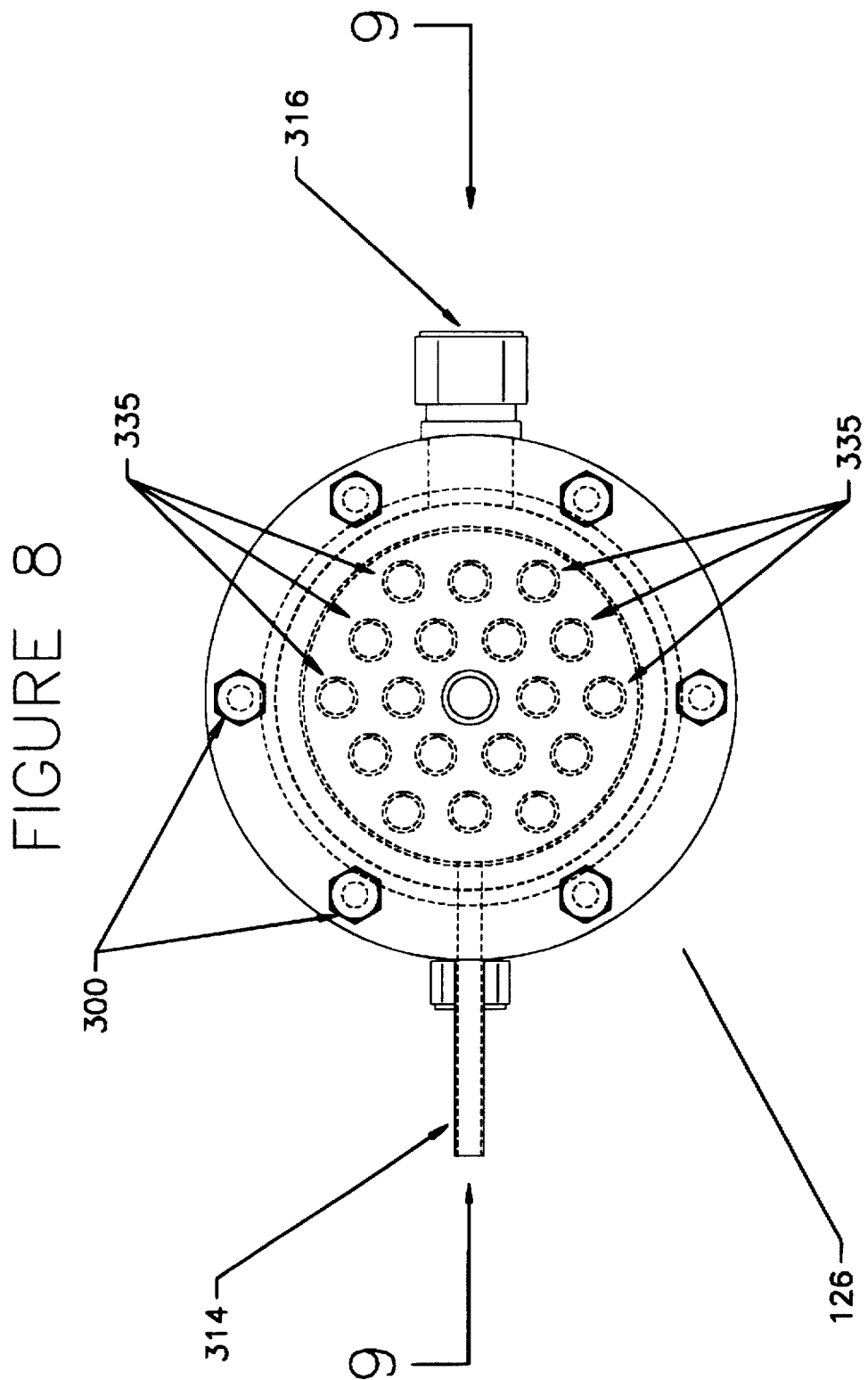
FIG. 8 is a top view of a preferred embodiment of the vapor generator used by the invention.

Referring particularly to FIGS. 6 and 7, process vessel 100 is constructed in such a way as to maintain integrity when an internal vacuum is applied. There are many ways to make a vacuum vessel, and the present invention is not limited to any one specific vacuum vessel design. The present invention will work equally well with other vacuum vessel construction methods, such as thick wall construction. The preferred embodiment utilizes 0.125" thick stainless steel walls with an exoskeleton comprised of square tubing 200 attached to the outer circumference of the vessel. Likewise, there are various lid and seal methods used in the vacuum industry and the present invention can incorporate the various types. The preferred embodiment uses a hinged lid 101 with an O-ring gasket seal 204 and piston actuated clamps 206.

Process vessel 100 includes various portals to introduce and evacuate fluids and vapors into and out of process vessel 100. It should be understood that the portals may change in quantity and design depending on size of the vessel and the chemicals used in the process. In the preferred embodiment, vapor is introduced into the vessel via vapor-in portal 208, which in the preferred embodiment is fabricated from Teflon tubing. Vapor-in portal 208 is fluidly connected to distribution manifold 202. Distribution manifold 202, has a plurality of holes along its length to provide uniform vapor dispersion onto the substrates. Teflon tubing is preferred because its low thermal conductivity provides for minimal vapor loss due to condensation although those skilled in the art will recognize that other materials may be suitable for this service including various grades of stainless steel. Alternatively, a distribution manifold may be incorporated directly into the lid or walls of process vessel 100.

Portions of process vessel 100 may be heated to reduce process cycle time and minimize vapor condensation in the process vessel. Heating is accomplished in the preferred embodiment using heated is a heating fluid, such as glycol/water mixture which is heated a remote heat exchanger (not shown) and pumped through tubing to a jacket surrounding all or portions of process vessel 100.

Figure 5:
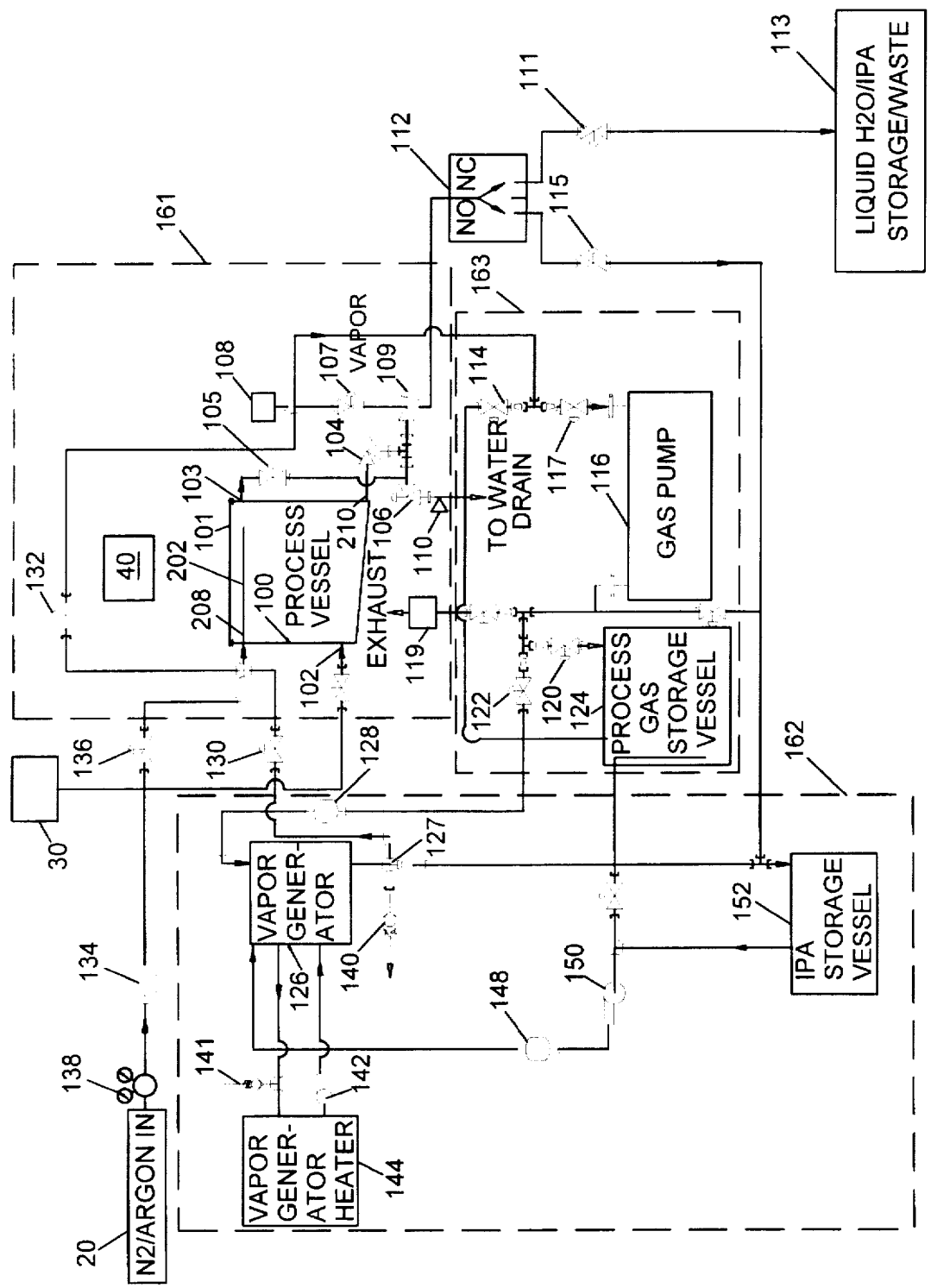
FIG. 5 is a schematic representation of the first embodiment of the invention.

Portal 210 acts both as the fluid drain and exit way for the vapor. Drain piping is arranged to minimize trapped liquids. FIG. 5 shows how the drain piping is configured.

Referring to FIG. 5, vapor recirculation subassembly 163 uses a commercially available gas pump 116 and piping connections to process vessel 100 and to vapor generation subassembly 162. Gas pump 116 is a commercially available dry diaphragm pump which isolates the process gas from the environment. Gas pump 116 provides total isolation of the process gas from the environment, while maintaining highest purity needed for critical applications. Gas pump 116 fulfills at least two important purposes: first, it pumps the process gas through vapor generator 126 and through process vessel 100 in a "closed loop" manner; and second, it is used to evacuate process vessel 100 of vapor atmosphere. Alternatively, two pumps may be used, one for pumping the process gas in a closed loop manner as described above, and a second for evacuating the process vessel. In either case, the process gas is drawn from process vessel 100 through drain portal 210 and main drain valve 104 into gas pump 116, inlet through pump isolation valve 117, exiting gas pump 116 through piping leading to valve 122, continuing on to vapor generator 126, through filter 128, returning to process vessel 100 through valve 130 and portal 208.

As shown in FIGS. 5, 9 and 10, vapor generation subassembly 162 of the present invention comprises a modified stainless steel shell and tube heat exchanger, piping which connects vapor generator 126 to gas pump 116 and process vessel 100, and means for introducing liquid IPA for vaporization. Process gas inlet tube 302 is welded to upper cover 304 which seals against upper mating flange 308 by means of an O-ring seated in groove 306 and compressed by nuts and bolts 300. Shell housing body 310 is welded to flange 308. Shell housing body 310 is divided into an upper, middle and lower region by upper baffle plate 312 and lower baffle plate 319. The upper region has portal 314 for liquid IPA entry. A plurality of tubes 335 connect the upper and the lower region, allowing process gas to pass through the middle region 313, which is the heating zone. Heat for vaporization is provided by a heating fluid, such as glycol/water mixture which is passed on the shell, or outer diameter, side of the tubes 335.

Referring to FIG. 5, the heating fluid is heated and recirculated through vapor generator 126 by means of heater 144 and pump 142. Both heater 144 and pump 142 are positioned remotely from the process vessel by wall dividers and are connected to vapor generator 126 by piping.

Referring to FIGS. 9 and 10, heating fluid is passed into and out of the middle region by portals 316 and 318. Process gas exits vapor generator 126 through outlet tube 321 along with any remaining liquid IPA. Lower flange 320 and cover 322 are sealed with an O-ring in the same manner as upper cover and flange 304 and 308.

Referring again to FIG. 5, process gas storage vessel 124 located in vapor recirculation subassembly 163 and IPA storage vessel 152 located in vapor generation subassembly 162 may be conventional stainless steel pressure vessels, such as those manufactured by Alloy Products, Inc. Process gas storage vessel 124 has volume capacity similar to the volume capacity of process vessel 100 and serves to store the process gas for use in a subsequent cycle or for further condensation of vapor prior to expulsion from the system. In the preferred embodiment of the invention, IPA storage vessel 152 has a volume of one gallon. In some cases a cooling coil (not shown) may be employed to jacket all or part of process gas storage vessel 124 to increase condensation.

The process cycle for a water rinse and vapor dry as shown in FIG. 1 will now be described with primary reference to FIG. 5. Process vessel 100 is filled with de-ionized water introduced through valved portal 102 from fluid source 30.

Lid 101 is opened and product to be rinsed and dried is placed into process vessel 100. Lid 101 is closed and sealed by means of clamping fixture 207 shown in FIG. 7. Overflow rinsing may now occur with water exiting through valved portal 103, valve 105 and valve 106. When the rinse is finished, usually between fifteen seconds and five minutes or more depending on the chemical process, valve 105 is closed and secondary evacuation valve 132 is opened allowing gas pump 116 to evacuate air located between the top surface of the water contained in process vessel 100 and lid 101, to a vacuum level of approximately 300 torr. This pumpdown provides assurance that a positive lid seal has been achieved, by checking for adequate vacuum level within a defined time, as measured by vacuum manometer 108 and removes most all $O_2$ from the system. Alternatively, overflow rinse portal 103 may be located high enough in process vessel 100 so that all air is displaced by the rinse water exiting through portal 103.

Water is drained from process vessel 100 through portal 210 by opening main drain valve 104 and water drain valve 106, which in the preferred embodiment is a bellows valves having a diameter greater than one inch. Inert gas, typically $N_2$, is introduced through portal 202 by opening gas storage vessel valve 136 which allows pressurized inert gas from inert gas storage 20 to backfill process vessel 100 effectively venting process vessel 100 as the water drains. The important feature of this phase of the process is that venting process vessel 100 during this portion of the process cycle allows the water or other cleaning fluid to drain from process vessel 100 in a substantially unimpeded manner.

When the water level in process vessel 100 is empty, as indicated by commercially available level sensor 110 preferably a fiber optic Teflon housed sensor, gas pump 116 is turned off and gas storage vessel valve 136 and water drain valve 106 are shut. Any remaining water is removed via piping through valve 109 being collected in piping above diverter 112 to be drained later through valve 111 to liquid waste 113.

Process gas recirculation is initiated by opening vapor return valve 107 and pump isolation valve 117 and starting gas pump 116. Gas pump 116 now acts as an atmospheric gas pump. Process gas is drawn from process vessel 100 through drain portal 210, main drain valve 104, vapor return valve 107 and pump isolation valve 117, into gas pump 116, exiting gas pump 116 through piping leading to vapor generator 126, through valve 122. Process gas continues on through vapor generator 126 saturating with IPA vapor as it passes through vapor generator 126, exiting the bottom of vapor generator 126, passing through junction 127, through valve 130 and into process vessel 100 via portal 208, being distributed within process vessel 100 by manifold 202. This completes the recirculation loop.

Referring to FIG. 2, 9 and 10 vapor is generated as follows: process gas passes through tubes 335. Liquid IPA is stored, at room temperature in IPA storage vessel 152. When process gas recirculation is started. IPA is pumped from IPA storage vessel 152 by pump 150 which may be a pneumatic driven metering pump such as those sold by Micropump, or explosion proof electric drive pump with flow of less than one gallon per minute. Filter 148 may be used to final filter the IPA which enters the tube side of vapor generator 126. Orifices 334, shown in FIG. 10, meter IPA onto the inner diameter wall of each tube while process gas passes parallel and concentric to the IPA flow down the inner wall of tubes 335. Referring to FIG. 9, the amount of IPA flowing down the inner wall of tubes 335 is regulated so that thin liquid layer 332, shown in FIG. 10, coats the inner wall of tubes 335 providing for a large wetted surface area and thus dense vapor generation. Regulation is accomplished by means of orifices 334 drilled into the side wall of the upper extensions of tubes 335.

Referring to FIG. 5, preferably, both vapor generator 126 and filter 128, as well any necessary piping leading to process vessel 100 are wrapped with conventional blanket insulation to minimize heat loss. The present invention can easily accommodate larger process vessel sizes, and thus larger substrates, because a second vapor generator can be added. Thus the vapor generator design is modular as concerns vapor capacity.

Un-vaporized liquid IPA exits vapor generator 126 down through junction 127 back into IPA storage vessel 152. Also entering IPA storage vessel 152 is IPA condensate gathered from process vessel 100 and which passes through diverter 112 and valve 115 back into IPA storage vessel 152. Emergency overpressure relief, is typically 25 psig, and is provided for both sides of vapor generator 126 via pressure relief valves 140 and 141. IPA storage 152 may use commercially available level sensors to check for low liquid level (not shown), and have means to replenish IPA level via externally located bulk IPA storage (not shown) or by manually filling the storage vessel.

After an initial period of vapor recirculation, water which was present on product 40 is washed off and flushed down to diverter 112 through IPA drain valve 109. Subsequent drainage consists of pure IPA condensate. Such drainage is diverted towards valve 115 for reclamation into IPA storage vessel 152, at the end of the drying process.

After one to five minutes, when water is rinsed from product 40 the vaporization portion of the process is finished. Now process gas is evacuated from process vessel 100 and stored in process gas storage vessel 124. Vapor generation subassembly 162 is isolated by shutting valves 130 and 122. Main drain valve 104 and vapor return valve 107 are shut. Evacuation of process vessel 100 proceeds through secondary evacuation valve 132 and pump isolation valve 117, through gas pump 116 and into process gas storage vessel 124 through valve 120. Evacuation of process vessel 100 continues until residual IPA in process vessel 100 is evaporated and vacuum level is such that a very small quantity of residual vapor is present in process vessel 100. For the preferred embodiment a vacuum of 15 torr is approached, leaving residual vapor well below current and future standards.

Process gas storage vessel 124 is evacuated through valve 114 pump isolation valve 117 and through gas pump 116 and exhaust shutoff valve 118 to exhaust. VOC emissions are minimal because of the limited volume of process gas, (approximately 1.5 cubic feet in the preferred embodiment) at room temperature (or below if gas chilling is used). Charcoal filter 119 captures the remaining vapor prior to exhaust. After this phase, process gas storage vessel 124 will be in a subatmospheric or vacuum state until it receives back the volume of gas from process vessel 100, at the end of the next process cycle.

At the end of the process, gas pump 116 is de-energized and all valves closed. Process vessel 100 is brought to atmospheric pressure by introducing inert gas from inert gas storage 20 into process vessel 100 via gas storage vessel valve 136. Secondary evacuation valve 132 is open so that vacuum manometer 108 can detect the end of the backfill.

Prior to initial operation, process gas storage vessel 124, IPA storage vessel 152 and vapor recirculation system 163 piping are evacuated and backfilled with an inert gas such as nitrogen. This gas acts as the carrier, or process gas for subsequent operation.

To adapt the apparatus of FIG. 5 for the process depicted in FIG. 2, that is a process which substitutes solvent cleaning for the water rinse, a solvent or cleaning fluid, typically IPA, from rinse fluid source 30 is piped to process vessel 100 through valved portal 102. Following a cleaning cycle, the solvent or cleaning fluid is drained through portal 210 to a sump or other storage vessel for disposal, treatment or recirculation to the process as required. Inert gas, typically $N_2$, is introduced through portal 202 by opening gas storage vessel valve 136 which allows pressurized inert gas from inert gas storage 20 to backfill process vessel 100 effectively venting process vessel 100 as the water drains. Alternatively, process gas may be drawn out of process gas storage vessel 124 and pumped into the top of the process vessel 100 to fill the void created by the exiting rinse water, through piping leading to valves 114 and 117 and into the inlet of gas pump 116, through and out of gas pump 116 through valve 122, through vapor generator 126 and into process vessel 100 through valve 130 and vapor distribution manifold 202. The process for solvent cleaning followed by vapor drying as shown in FIG. 2 proceeds from this point on just as the process for a water rinse followed by vapor drying.

Initially, process vessel 100 is purged with an inert gas from inert gas storage 20 which is piped through regulator 138 and filter 134 before entering process vessel 100 through gas storage vessel valve 136 and portal 208. Lid 101 is opened and product to be cleaned and dried is placed into process vessel 100. Lid 101 is closed and sealed. Cleaning may now occur with solvent exiting through valved portal 103 and valve 105. When cleaning is complete, usually between fifteen seconds and five minutes depending on the chemical process the solvent is drained from process vessel 100 through portal 210 by opening main drain valve 104 and drain valve 106. $N_2$ is introduced through portal 202 by opening gas storage vessel valve 136 which allows pressurized inert gas from inert gas storage 20 to backfill process vessel 100 effectively venting process vessel 100 as the solvent drains. Vapor drying follows as described above.

To adapt the apparatus of FIG. 5 for the process depicted in FIG. 3, that is, a "dry only" process, fluid piping is either eliminated altogether or isolated by closing valved portal 102 and water drain valve 106. The "dry only" process begins initially by purging process vessel 100 with an inert gas from inert gas storage 20 which is piped through regulator 138 and filter 134 before entering process vessel 100 through gas storage vessel valve 136 and portal 208. Once process vessel 100 is purged, lid 101 is opened and product to be dried is placed into process vessel 100. Lid 101 is closed and sealed. The inert gas purge continues through the loading of product and is stopped once process vessel 100 is sealed. Vapor drying follows as described above. Following drying, process gas is withdrawn from process vessel 100 and stored in process gas storage vessel 124. Vapor generation subassembly 162 is isolated by shutting valves 130 and 122. Main drain valve 104 and vapor return valve 107 are shut. Evacuation of process vessel 100 proceeds through secondary evacuation valve 132 and pump isolation valve 117, through gas pump 116 and into process gas storage vessel 124 through valve 120. Evacuation of process vessel 100 continues until residual IPA in process vessel 100 is evaporated and vacuum level is such that a very small quantity of residual vapor is present in process vessel 100. For the preferred embodiment a vacuum of 15 torr is approached.

Process vessel 100 is brought to atmospheric pressure by introducing nitrogen via gas storage vessel valve 136. Secondary evacuation valve 132 is open so that vacuum manometer 108 can detect the end of the backfill.

The apparatus for the process depicted in FIG. 4, that is, the alternative "dry only" process, is identical to the apparatus used for the "dry only" process depicted in FIG. 3. The process varies from the "dry only" process depicted in FIG. 3 in that process vessel 100 is not pumped down to a subatmospheric level during the evacuation of vapor portion of the process cycle and process vessel 100 is not backfilled with an inert gas following evacuation of vapor. Rather, process vessel 100 is simply unsealed following evacuation of vapor admitting clean room air into process vessel 100. Alternatively, an inert gas may be introduced from inert gas storage 20 which is piped through regulator 138 and filter 134 before entering process vessel 100 through gas storage vessel valve 136 and portal 208 to complete the drying.

While there is shown and described the preferred embodiment of the invention, it is to be distinctly understood that this invention is not limited thereto but may be variously embodied to practice within the scope of the following claims.

I claim:

1. An apparatus for drying cleaning solvent or water off an object, the apparatus having a vacuum tight process vessel for holding an object to be dried, the vessel including a closeable opening therein and an outlet for draining fluid from the vessel, vapor distribution means located within the vessel for distributing vapor therein; and a vapor generator being located outside of the vessel and in fluid communication with the vapor distribution means for generating a vapor of a drying fluid which is soluble in water or the cleaning solvent, comprising:

a recirculation loop having a a first end in fluid communication with the outlet of the process vessel and a second end in fluid communication with the vapor generator for recirculating vapor from the vessel to the vapor generator, a vapor storage vessel installed within the recirculation loop for storing vapor and a pump installed within the recirculating loop configured to evacuate vapor from the process vessel and deposit the vapor to the vapor storage vessel and configured for pumping vapor from the vapor storage vessel and to the vapor generator.

2. The apparatus of claim 1 wherein the recirculation loop further comprises valve means for switching the pump between a vapor pumping mode, wherein the pump is in fluid communication with the vapor storage vessel and the process vessel and is isolated from the vapor generator for evacuating the process vessel of drying fluid for deposit in the vapor storage vessel; and a vapor pumping mode wherein the pump is in fluid communication with the process vessel and the vapor generator and is isolated from the vapor storage vessel and configured to pump vapor from the process vessel through the pump to the vapor generator in a closed loop manner.

3. The apparatus of claim 1 wherein the recirculation loop further comprises a liquid storage vessel for storing condensed drying fluid.

4. The apparatus of claim 1 wherein the recirculation loop further comprises a first in fluid communication with the vapor storage vessel and the process vessel and is isolated from the vapor generator for evacuating the process vessel of drying fluid for deposit in the vapor storage vessel; and a second pump in fluid communication with the process vessel and the vapor generator and is isolated from the vapor storage vessel and configured to pump vapor from the process vessel through the pump to the vapor generator in a closed loop manner.

5. A vapor generator for use in a vapor drying apparatus which comprises:

an outer shell housing being divided into an upper region, a middle region and a lower region, the housing including a liquid drying fluid inlet in fluid communication with the upper region, a heating fluid inlet and a heating fluid outlet both in fluid communication with the middle region, a liquid drying fluid outlet in fluid communication with the lower region, a vapor inlet in fluid communication with the upper region and a vapor outlet in fluid communication with the lower region;

a thermally conductive tube having an interior surface surrounding a central passageway, the tube passing through the middle region to connect the upper and the lower regions allowing process gas to pass between the upper and lower regions through the middle region which is here defined as the heating zone; and means for metering a restricted amount of drying fluid onto the interior surface of the tube.

6. The vapor generator of claim 5 wherein the means for metering drying fluid comprises:

the tube having an upper extension thereof extending into the upper region of the shell housing to define a drying fluid dam around the central passageway of the tube; and the upper extension having a hole therein for passing a restricted amount of drying fluid to the interior surface of the tube.

\* \* \* \* \*